(12) United States Patent
Zeidler et al.

(10) Patent No.: US 11,087,955 B2
(45) Date of Patent: Aug. 10, 2021

(54) SYSTEM COMBINATION OF A PARTICLE BEAM SYSTEM AND A LIGHT-OPTICAL SYSTEM WITH COLLINEAR BEAM GUIDANCE, AND USE OF THE SYSTEM COMBINATION

(71) Applicant: Carl Zeiss MultiSEM GmbH, Oberkochen (DE)

(72) Inventors: Dirk Zeidler, Oberkochen (DE); Michael Schall, Essingen (DE); Joerg Jacobi, Herbrechtingen (DE); Michel Le Maire, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 16/939,706

(22) Filed: Jul. 27, 2020

(65) Prior Publication Data

US 2021/0035773 A1 Feb. 4, 2021

(30) Foreign Application Priority Data

Jul. 31, 2019 (DE) .......................... 102019005364.8

(51) Int. Cl.
*H01J 37/22* (2006.01)
*H01J 37/10* (2006.01)
(Continued)

(52) U.S. Cl.
CPC ............ *H01J 37/228* (2013.01); *H01J 37/10* (2013.01); *H01J 37/147* (2013.01);
(Continued)

(58) Field of Classification Search
CPC ........ H01J 37/228; H01J 37/10; H01J 37/147; H01J 37/244; H01J 37/28; H01J 2237/152;
(Continued)

(56) References Cited

U.S. PATENT DOCUMENTS 6,310,341 B1 10/2001 Todokoro et al.
6,403,967 B1 6/2002 Chen et al.
(Continued)

FOREIGN PATENT DOCUMENTS

DE  10 2008 001 812 A1  12/2009
DE  10 2010 011 898 A1  9/2011
(Continued)

*Primary Examiner* — David A Vanore
(74) *Attorney, Agent, or Firm* — Fish & Richardson P.C.

(57) ABSTRACT

A system combination includes a particle beam system and a light-optical system. The particle beam system can be an individual particle beam system or a multiple particle beam system. A light entry mechanism can provided at a branching site of a beam tube arrangement within a beam switch. A light beam of the light-optical system can enter into the beam tube arrangement through the light entry mechanism such that the light beam impinges, in substantially collinear fashion with particle radiation, on an object to be inspected. Parts of the light-optical beam path and parts of the particle-optical beam path can extend parallel to one another or overlap with one another. This arrangement can allow light of the light-optical system to be incident in perpendicular fashion on an object to be inspected, optionally without impairing the particle-optical resolution of the particle beam system.

28 Claims, 4 Drawing Sheets

(51) Int. Cl.
*H01J 37/147* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/152* (2013.01); *H01J 2237/2445* (2013.01); *H01J 2237/2448* (2013.01); *H01J 2237/28* (2013.01)

(58) Field of Classification Search
CPC ....... H01J 2237/2445; H01J 2237/2448; H01J 2237/28; G01N 2223/66; G01N 2223/418
See application file for complete search history.

(56) References Cited

U.S. PATENT DOCUMENTS

| | | | |
|---|---|---|---|
| 6,465,781 B1 | 10/2002 | Nishimura et al. | |
| 6,812,461 B1 | 11/2004 | Adler et al. | |
| 7,205,542 B1 * | 4/2007 | Mankos | H01J 37/228 |
| | | | 250/306 |
| 10,741,355 B1 * | 8/2020 | Zeidler | H01J 37/28 |
| 10,811,215 B2 * | 10/2020 | Zeidler | H01J 37/10 |
| 10,854,423 B2 * | 12/2020 | Sarov | H01J 37/3177 |
| 10,896,800 B2 * | 1/2021 | Riedesel | H01J 37/147 |
| 2004/0169141 A1 * | 9/2004 | Adamec | H01J 37/265 |
| | | | 250/310 |
| 2004/0222377 A1 | 11/2004 | Shinada et al. | |
| 2009/0256075 A1 * | 10/2009 | Kemen | H01J 37/147 |
| | | | 250/307 |
| 2010/0044566 A1 * | 2/2010 | Donitz | B08B 7/0042 |
| | | | 250/311 |
| 2011/0226949 A1 * | 9/2011 | Zeidler | H01J 37/09 |
| | | | 250/310 |
| 2013/0187046 A1 * | 7/2013 | Zeidler | H01J 37/21 |
| | | | 250/310 |
| 2013/0284924 A1 | 10/2013 | Mizuochi et al. | |
| 2014/0367586 A1 * | 12/2014 | Frosien | H01J 37/045 |
| | | | 250/397 |
| 2015/0083911 A1 * | 3/2015 | Zeidler | H01J 37/285 |
| | | | 250/310 |
| 2015/0348738 A1 * | 12/2015 | Zeidler | H01J 37/28 |
| | | | 250/396 R |
| 2016/0181054 A1 | 6/2016 | Knippelmeyer et al. | |
| 2016/0211112 A1 | 7/2016 | Nakao et al. | |
| 2017/0117114 A1 * | 4/2017 | Zeidler | H01J 37/28 |
| 2017/0294287 A1 | 10/2017 | Knippelmeyer et al. | |
| 2017/0316912 A1 * | 11/2017 | Zeidler | H01J 37/28 |
| 2019/0355545 A1 * | 11/2019 | Zeidler | H01J 37/05 |
| 2020/0211810 A1 * | 7/2020 | Zeidler | H01J 37/21 |
| 2020/0251301 A1 * | 8/2020 | Zeidler | H01J 37/18 |
| 2020/0373116 A1 * | 11/2020 | Zeidler | H01J 37/09 |
| 2021/0118661 A1 * | 4/2021 | Corkum | H01J 49/025 |

FOREIGN PATENT DOCUMENTS

| | | |
|---|---|---|
| DE | 10 2013 014 976 A1 | 3/2015 |
| WO | WO 2005/024881 A2 | 3/2005 |
| WO | WO 2007/028595 | 3/2007 |
| WO | WO 2007/028596 | 3/2007 |
| WO | WO 2007/060017 | 5/2007 |
| WO | WO 2011/124352 | 10/2011 |

\* cited by examiner

SYSTEM COMBINATION OF A PARTICLE BEAM SYSTEM AND A LIGHT-OPTICAL SYSTEM WITH COLLINEAR BEAM GUIDANCE, AND USE OF THE SYSTEM COMBINATION

CROSS-REFERENCE TO RELATED APPLICATION

This application claims benefit under 35 U.S.C. § 119 to German Application No. 10 2019 005 364.8, filed Jul. 31, 2019. The contents of this application is hereby incorporated by reference in its entirety.

FIELD

The disclosure relates to a system combination made of a particle beam system and a light-optical system. Here, the particle beam system generally has a multiple particle beam system.

BACKGROUND

Just like single-beam particle microscopes, multi-beam particle microscopes can be used to analyze objects on a microscopic scale. Images of an object that represent a surface of the object, for example, can be recorded using these particle microscopes. In this way, for example the structure of the surface can be analyzed. While in a single-beam particle microscope an individual particle beam of charged particles, such as electrons, positrons, muons or ions, is used to analyze the object, in a multi-beam particle microscope, a plurality of particle beams are used for this purpose. The plurality of the particle beams, also referred to as a bundle, is directed onto the surface of the object at the same time, as a result of which a significantly larger area of the surface of the object can be sampled and analyzed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed onto a multi-aperture plate having a multiplicity of openings. One portion of the electrons of the electron beam impinges the multi-aperture plate and is absorbed there, and another portion of the beam passes through the openings in the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, such that the electron beams are focused in a plane situated at a distance from the multi-aperture plate. The plane in which the foci of the electron beams are formed is imaged by a downstream optical unit onto the surface of the object to be examined, such that the individual electron beams impinge the object in a focused manner as primary beams. There they generate interaction products, such as backscattered electrons or secondary electrons, emanating from the object, which are shaped to form secondary beams and are directed onto a detector by a further optical unit. There each of the secondary beams impinges a separate detector element such that the electron intensities detected by the detector element provide information relating to the object at the site at which the corresponding primary beam impinges the object. The bundle of primary beams is scanned systematically over the surface of the object in order to generate an electron micrograph of the object in the manner that is customary for scanning electron microscopes.

As a matter of principle, light-optical systems generally provide different inspection possibilities for samples than particle-optical systems. Therefore, there is an increased need for combining particle-optical systems with light-optical systems in order to be able to exploit, and combine, the respective strengths of the different systems. Thus, DE 10 2010 011 898 A1, for example, describes a combined inspection system, in which light-optical components have been inserted into a particle-optical beam path of an individual particle beam system and have been provided with passage openings for the particle beam.

The spatial conditions can represent a particular challenge in a system combination of a multiple particle beam system and a light-optical system. In the case of a multiple particle beam system, a particle-optical objective lens is often situated comparatively closely to the object to be examined and can involve comparatively large amounts of space, and so an incidence of light past the particle-optical objective lens is only possible at a grazing angle of incidence a of the light (see, e.g., US 2013/0284924 A1 and US 2016/0211112 A1). This grazing incidence of light is also illustrated in FIG. 4 of this patent application and is generally only sufficient for certain light-optical applications.

If there were additional openings for light beams in the particle-optical objective lens or in its pole shoes, the openings would tend to have a negative effect on the resolution obtainable by the particle-optical objective lens.

U.S. Pat. No. 7,205,542 B1 discloses an individual beam scanning electron microscope with a curved optical axis, which additionally discloses an optical system with a laser. The laser beam impinges a sample in collinear fashion with the individual particle beam.

U.S. Pat. No. 6,403,967 B1 discloses details about a beam tube used in particle beam systems.

US 2016/0181054 A1 discloses a particle-optical objective lens, usable both in individual beam and multi-beam systems. A combination of a particle-optical system with a light-optical system cannot be gathered from the document.

US 2017/0294287 A1 likewise discloses a specific objective lens arrangement.

US 2004/0222377 A1 discloses a wafer inspection system, in which backscattered electrons are used for imaging. Here, secondary electrons are separated from backscattered electrons in a beam switch.

U.S. Pat. No. 6,812,461 B1 discloses a particle beam system which is combined with a laser, the laser being used for electronic excitation of a photocathode. The electrons released thus then impinge a sample.

DE 10 2008 001 812 A1 discloses a positioning appliance for a particle beam device. Here, a particle-optical system is combined with a light-optical system. The emitted light beam is used to position a holder. In the process, there is a collinear beam guidance of the light beam and the particle beam. The system does not contain a beam switch.

SUMMARY

The present disclosure seeks to provide an improved system combination of a multiple particle beam system and a light-optical system which can allow both particle beams and light beams to respectively impinge an object in substantially perpendicular fashion without reducing the resolution of the particle-optical system in the process.

A first aspect of the disclosure provides a system combination including:
- a multiple particle beam system providing a particle-optical beam path, the multiple particle beam system including:
  - a multi-beam particle source, which is configured to generate a first field of a multiplicity of first particle beams;
  - a first particle-optical unit with a first particle-optical beam path, the first particle-optical unit being configured to direct the first particle beams onto an object plane such that the first particle beams impinge the object plane at sites of incidence, which form a second field;
  - a detector unit with a plurality of detection regions, the detection regions being disposed in a third field;
  - a second particle-optical unit with a second particle-optical beam path, the second particle-optical unit being configured to image second particle beams, which emanate from the sites of incidence in the second field, onto the third field;
  - a particle-optical objective lens, through which both the first and the second particle beams pass; and
  - a beam switch, disposed in the first particle-optical beam path between the multi-beam particle source and the objective lens and disposed in the second particle-optical beam path between the objective lens and the detector unit, the first particle-optical beam path and the second particle-optical beam path branching, in particular in Y-shaped fashion, within the beam switch,
  - wherein the beam switch has a beam tube arrangement, in which the particle-optical beam path extends within the beam switch, and wherein the beam tube arrangement branches, in particular in Y-shaped fashion, at a branching site;
  - wherein a light entry mechanism is provided at the branching site of the beam tube arrangement; and
- a light-optical system providing a light-optical beam path, the light-optical system including:
  - a light source; and
  - a light-optical unit, the light-optical unit being configured to direct a light beam onto the object plane,
  - wherein the light beam enters the beam tube arrangement through the light entry mechanism in such a way that the light beam impinges the object plane in substantially collinear fashion with the first particle beams.

The object plane is a plane defined by the set system parameters of the particle beam system, in which it is possible with the aid of a stage to position the surface of an object to be examined.

The charged particles can be, e.g., electrons, positrons, muons or ions or other charged particles. Optionally, the charged particles are electrons generated, e.g., using a thermal field emission source (TFE). However, other particle sources can also be used.

The light used in the light-optical system can be light, i.e., electromagnetic radiation, of any wavelength, which is generated by a narrowband light source, such as a laser, or by a broadband light source. The wavelengths of the light can lie in the visible spectral range or outside of the visible spectral range, for instance in the infrared spectral range or in the ultraviolet spectral range.

The beam switch is a specific particle beam splitter. It optionally has one or more magnetic sectors for deflecting particle beams. The magnetic fields provided by the magnetic sectors are optionally substantially homogeneous. In addition to the magnetic sectors, in which particle beams are deflected in the beam switch, the beam switch optionally has drift regions, in which no magnetic field is applied. However, in addition to this described embodiment, other configurations of the beam switch are also conceivable. In any case, the branching of the particle-optical beam path is obtained in the beam switch with the aid of the beam switch and the fields generated therein.

The beam switch has a beam tube arrangement. Here, this beam tube arrangement surrounds the particle-optical beam paths within the beam switch. The beam tube arrangement can start upstream of the beam switch and also be continued downstream of the beam switch. The beam tube arrangement as such offers the advantage that a better vacuum, in particular a high vacuum, can be generated better within the beam tube arrangement. Typical values for these pressures are less than $10^{-5}$ mbar, optionally less than $10^{-7}$ mbar and/or $10^{-9}$ mbar. A typical diameter d of the beam tube arrangement or the beam tube sections or beam tube limbs belonging thereto is 5 mm≤d≤30 mm, optionally 10 mm≤d≤25 mm.

According to the disclosure, a light entry mechanism is provided at the branching site of the beam tube arrangement. Thus, this light entry mechanism is optically transparent to light of the light-optical system of the system combination. The branching site of the beam tube arrangement is understood to mean a region of the beam tube, or its wall, where the branching takes place. In the case of a Y-shaped branching, the branching site is situated between the two upper limbs of the Y and hence at the branching site furthest away from the object plane. Here, the description as Y-shaped only serves illustrative purposes. It is not necessary for the beam tube arrangement to have an axis of symmetry passing through the branching site. Equally, this is possible.

As a result of the described arrangement of the light entry mechanism at the envelope of the beam tube arrangement at the branching site, it is possible to couple light into the beam switch in such a way that a particle-optical beam is not impaired by light-optical components. At the same time, it is possible to allow the input coupled light to impinge the object plane and hence a surface of an object positioned in the object plane in substantially collinear fashion with the first particle beams.

According to the disclosure, the light beam enters the beam tube arrangement through the light entry mechanism in such a way that the light beam impinges the object plane in substantially collinear fashion with the first particle beams. Thus, it is imaged onto the object or an object plane. In this case, collinearity between the first particle beams and the light beam means that their direction vectors are either identical or truly parallel to one another. Substantially collinear means that, for an angle β between the light beam and the first particle beams, the following applies: $β≤10°$, optionally $β≤5°$ and/or $β≤1°$. The illumination spot of the light beam on the object or in the object plane can be situated at the same site on the object as one of the first particle beams in this case; however, this is not necessarily the case. By way of example, the illumination spot can also be located next to the site of incidence of a first particle beam and/or next to the sites of incidence of all first particle beams. Optionally, the light beam and the first particle beams extend in collinear fashion with the optical axis of the particle-optical objective lens within the particle-optical objective lens. Here, the optical axis of the particle-optical objective lens is defined, for example, by the axis of rotation of a rotationally symmetric particle-optical objective lens and/or by the axis of rotation of the pole shoes thereof.

According to some embodiments disclosure, the first particle beams and the light beam impinge the object plane in substantially perpendicular fashion. This orientation of the first particle beams or primary particle beams relative to the light beam can offer, for example, the advantage of a more accurate inspection of the object or its properties with the aid of the light beam. In particular, it is possible to determine a position or height of the object, in particular a working distance of the system from the object, and/or a height profile of the object more precisely with the aid of the light beam.

According to some embodiments of the disclosure, the beam tube arrangement has three beam tube limbs. Here, generally, only the first particle-optical beam path extends through the first limb and only the second particle-optical beam path extends through the second limb. Both the first particle-optical beam path and the second optical beam path extend through the third limb. Then, a branching site of the beam tube arrangement is situated at the transition between the first limb and the second limb. Then, the light entry mechanism is provided at this branching site. An angle γ between the particle-optical beam path in the first limb and the particle-optical beam path in the second limb is typically $15° \leq \gamma \leq 65°$.

According to some embodiments of the disclosure, the first and the second particle-optical beam path extend at least partly in parallel through the third limb and the first and the second particle-optical beam path emerge from the third limb in a z-direction defined thus. Here, generally, the light-optical unit is configured such that the light beam entering into the beam tube appliance from the light entry mechanism impinges the object plane in collinear fashion with the first particle beams in the z-direction. Here, generally, this z-direction can be aligned perpendicular to a surface of the object; however, this is not necessarily the case.

According to some embodiments of the disclosure, the first particle beams and the light beam impinge the object plane in substantially perpendicular fashion. Then, the above-defined z-direction is oriented perpendicular to the object plane.

According to some embodiments of the disclosure, the beam switch has a light channel, such as a bore, from its outer face to the light entry mechanism in the light-optical beam path. Here, the light channel thus can describe a region of the light-optical beam path which extends within the beam switch. It is not necessary for the light channel to be a separate component of the system combination. Rather, the term light channel serves for the further conceptual description of the disclosure. The light channel can have a straight line, bent or angled embodiment. It is typically short and its length 1 is optionally $25 \text{ mm} \leq 1 \leq 100 \text{ mm}$.

According to some embodiments of the disclosure, a light entry direction into the light channel, and hence into the beam switch, extends substantially perpendicular to the plane that is spanned by the beam tube arrangement. In the case of a Y-shaped beam tube arrangement, the limbs of the Y thus lie within the plane and the light entry direction in the light channel extends perpendicular to this plane. This arrangement allows the light channel to be kept as short as possible.

According to some embodiments of the disclosure, the beam switch has one or more magnetic sectors along the curved particle trajectories for deflecting the particle beams, wherein the light channel does not intersect any of the magnetic sectors. Even if a plurality of magnetic sectors are provided, as is typically the case, there is some space between the various magnetic sectors. Then, the light channel extends between these magnetic sectors. Typically, a structure is used to secure the magnetic sectors. The light channel can extend within this structure. Here, too, it is possible for the light entry direction into the light channel to extend substantially perpendicular to the plane spanned by the beam tube arrangement.

According to some embodiments of the disclosure, a light deflection mechanism is provided within the light channel in order to deflect the light beam by approximately 90° in particular. This deflection allows light to be coupled into the beam switch or into the light channel over the shortest possible path, but nevertheless allows the light to enter into the beam tube arrangement in such a way that it impinges the object plane in collinear fashion with the first particle beams. The typically very limited space in the system combination with the particle beam system is exploited very well in this way.

According to some embodiments of the disclosure, the light deflection mechanism deflects the light beam by approximately 90° and the incidence direction of the light beam onto the light deflection mechanism extends substantially parallel to the object plane and/or extends perpendicular to the plane spanned by the beam tube arrangement. This takes account of the specific desired spatial properties of the system combination.

According to some embodiments of the disclosure, the light deflection mechanism has a mirror or a prism. The prism is optionally a right-angled prism, with total internal reflection by substantially 90° occurring at the inner face of its hypotenuse. The light entry into or exit from the prism occurs through the two small side faces of the prism. In this embodiment variant of the disclosure it is possible to combine the light deflection mechanism with the light entry mechanism. Accordingly, the light entry mechanism optionally has a prism that serves as a light deflection mechanism at the same time. Then, the prism is optionally applied directly to the beam tube arrangement and, in particular, adhesively bonded thereon. This embodiment variant can reduce the number of elements for the system combination according to the disclosure.

According to some embodiments of the disclosure, the light entry mechanism has a window. Then, a mirror is optionally used as a light deflection mechanism in this embodiment variant, the light entering onto the light entry mechanism or through the window into the beam tube arrangement from the mirror. In this embodiment of the disclosure, the light deflection mechanism optionally can be provided in stationary fashion with respect to the magnetic sector or the magnetic sectors. Here, stationary means a relative position between the two parts that is known with very high precision, achieved by a rigid connection between the parts. By way of example, to this end, the light deflection mechanism can be fastened to the same structure on which the magnetic sectors are also secured. Normally, the magnetic sectors and the particle-optical objective lens have a relative position that is set very precisely with respect to one another. If the light deflection mechanism is also fastened to the structure on which the magnetic sectors are also secured, the light deflection mechanism can also be disposed very precisely relative to the particle-optical objective lens.

Independently of whether use is made of a combination of mirror and window or a prism or a combination of the aforementioned options, the light entry mechanism optionally has a coating on the beam tube side, the coating being electrically conductive and optically transparent. This can prevent unwanted beam tube-side charging of the light entry mechanism. Thus, for example, the window can be coated in electrically conductive and optically transparent fashion on the beam tube side. A short side of a prism, in particular of a right-angled prism, aligned to the beam tube arrangement, for example, can be coated in electrically conductive and optically transparent fashion.

Optionally, the coating contains ITO (indium tin oxide) or a metallic coating, e.g., aluminum, respectively with a layer thickness s in the nanometer range. Optionally, the following relation applies to the layer thickness s: 1 nm≤s≤200 nm. However, other coatings are also possible for as long as these are electrically conductive and optically transparent. It would also be conceivable to select an electrically conductive and optically transparent material for the light entry mechanism overall.

According to a further embodiment of the disclosure, the beam tube arrangement contains copper and/or titanium and/or the beam tube arrangement is made from one piece, at least in the region of the beam switch. The two materials, copper and titanium, were found to be particularly suitable in practice. Here, the beam tube arrangement made from one piece is understood to mean that the beam tube arrangement is produced from one piece and produced without connections. The latter means that the walls of the beam tube arrangement are not formed by virtue of different parts being put together to form the beam tube arrangement. Accordingly, the walls of the beam tube arrangement have no weld points or weld seams and no solder points or solder seams. This can be advantageous in that the beam tube arrangement does not disturb the magnetic field within the beam tube arrangement, which in turn reduces aberrations and improves the resolution. Moreover, this can allow a better vacuum to be achieved within the beam tube arrangement since the inner surface of the beam tube arrangement can be kept clean more easily and small leaks or leakages can be less likely to occur.

According to some embodiments of the disclosure, a vacuum along the particle-optical beam path and/or a high vacuum within the beam tube arrangement is provided in the particle beam system. Typical values for a vacuum or high vacuum are pressures less than $10^{-5}$ mbar, optionally less than $10^{-7}$ mbar and/or $10^{-9}$ mbar. This can improve the resolution of the particle beam system.

According to some embodiments of the disclosure, the particle-optical objective lens is a magnetic lens or an electrostatic lens or a combined magnetic/electrostatic lens and/or the particle-optical objective lens has a single opening, through which the first particle beams, the second particle beams and the light beam pass. Thus, apart from this single opening, no further opening is provided in this case for a passage of particle beams and light beams. Such a particle-optical objective lens can involve a comparatively large amount of space and is typically situated very close to the object to be inspected. Particularly when using such a particle-optical objective lens, it is believed that it has previously not been possible to work with a system combination with the aid of which a light beam impinges a surface of the object or the object plane in substantially collinear fashion with primary particle beams and, in particular, in substantially perpendicular fashion.

According to some embodiments of the disclosure, the light-optical system furthermore has a light detector. This can relate, in particular, to those system combinations in which light initially impinges the object as described above and the light is subsequently also reflected by the object again. Thus, the entire light-optical beam path can be run through substantially twice in this embodiment, once within the scope of incidence on the object and then, once again, following the reflection at the object. According to some embodiments of the disclosure, a light-optical beam splitter is disposed in the light-optical beam path, firstly, between the light source and the light entry mechanism and, secondly, between the light entry mechanism and the light detector. Alternatively, the light detector could also be disposed at a different site, for example in order to detect light scattered from the object in other directions or light emitted in any other way.

According to a some embodiments further embodiment of the disclosure, the particle-optical system and/or the light-optical system is configured to carry out a scanning movement with a particle beam and/or light beam in the object plane, and hence on the object. In the particle-optical system, this is optionally implemented by so-called scan deflectors. Typically, there is no change in an angle of incidence of the particle beam on the object in the process. By way of example, the scan deflectors can be electrostatic deflectors. Alternatively, these can be magnetic deflectors. In particular, these scan deflectors can be situated between the beam switch and the particle-optical objective lens. Here, the scan deflectors can be disposed in the vicinity of the back focus of the particle-optical objective lens.

By way of example, a scanning movement with a light beam on the object can be achieved by tiltable mirrors, which are electrically driven. There can be sufficient space for slight tilt movements in the described embodiments of the system combination.

According to some embodiments of the disclosure, no further light-optical components are provided in the light-optical beam path between the light entry mechanism and the object plane. Thus, in no way could potential light-optical components such as lenses or mirrors impair the particle-optical beam path. This can contribute to an improved resolution.

According to some embodiments of the disclosure, no light-optical component is provided in the first particle-optical beam path and/or in the second particle-optical beam path. Here, too, the particle-optical beam path extends completely undisturbed. This can be rendered possible by the targeted selection of the input coupling site of the light beams into the particle beam system, such as at the branching site of the beam tube arrangement within the beam switch.

According to some embodiments of the disclosure, the light source is a laser. This can be advantageous, in particular, if a position of the object or a height profile of the object should be determined precisely with the aid of the light-optical system. The laser can operate in continuous or pulsed fashion.

A second aspect of the disclosure provides a system combination including the following:
  a particle beam system providing a particle-optical beam path, the particle beam system including:
    a multiple particle beam system providing a particle-optical beam path, the multiple particle beam system including:

a multi-beam particle source, which is configured to generate a first field of a multiplicity of first particle beams;

a first particle-optical unit with a first particle-optical beam path, the first particle-optical unit being configured to direct the first particle beams onto an object plane such that the first particle beams impinge the object plane at sites of incidence, which form a second field;

a detector unit with a plurality of detection regions, the detection regions being disposed in a third field;

a second particle-optical unit with a second particle-optical beam path, the second particle-optical unit being configured to image second particle beams, which emanate from the sites of incidence in the second field, onto the third field;

a particle-optical objective lens, through which both the first and the second particle beams pass; and a beam switch, disposed in the first particle-optical beam path between the multi-beam particle source and the objective lens and disposed in the second particle-optical beam path between the objective lens and the detector unit, the first particle-optical beam path and the second particle-optical beam path branching, in particular in Y-shaped fashion, within the beam switch, wherein the beam switch has a beam tube arrangement, in which the particle-optical beam path extends within the beam switch, and wherein the beam tube arrangement branches, in particular in Y-shaped fashion, at a branching site;

wherein a light entry mechanism is provided at the branching site of the beam tube arrangement; and a light-optical system providing a light-optical beam path, the light-optical system including:

a light detector; and a light-optical unit, the light-optical unit being configured to direct a light beam emanating from the object plane onto the light detector, wherein the light beam emanating from the object plane enters into the beam tube arrangement in substantially collinear fashion with the second particle beams and leaves the beam tube arrangement through the light entry mechanism.

In such embodiments, light may not be radiated onto the object that is centerstage. Instead, such embodiments can involve detecting light emanating from the object. Here, the light to be detected can be generated in the object and emanate from the latter, for example as a result of cathodoluminescence. This light can be detected by the described embodiment variant according to the second aspect of the disclosure.

Thus, such embodiment variants of the disclosure does not require the provision of a separate light source for the light-optical system. However, a light source may be naturally present at least inherently in that case. However, in principle, it is also possible to combine the system combination according to the second aspect of the disclosure with an additional light source or, more generally, combine the system combination according to the first aspect of the disclosure with the system combination according to the second aspect of the disclosure.

According to some embodiments the disclosure, the light beam emanating from the object in the object plane enters into the beam tube arrangement in substantially collinear fashion with the second particle beams and subsequently leaves the beam tube arrangement through the light entry mechanism. To this end, the light beam can emerge from the object plane in substantially collinear fashion with the second particle beams. Collinearity between the second particle beams and the light beam means that their direction vectors are either identical or truly parallel to one another in this case. Substantially collinear means that, for an angle $\beta$ between the light beam and the second particle beams, the following applies: $\beta \leq 10°$, optionally $\beta \leq 5°$ and/or $\beta \leq 1°$. The starting site of the light beam from the object can be situated at the same site on the object as the starting site of a second particle beam in this case; however, this is not necessarily the case. By way of example, the starting site of the light beam could also be located next to the starting site of the second particle beam and/or next to the starting sites of all second particle beams. Optionally, the light beam and the second particle beams extend in collinear fashion with the optical axis of the particle-optical objective lens within the particle-optical objective lens. Here, the optical axis of the particle-optical objective lens is defined, for example, by the axis of rotation of a rotationally symmetric particle-optical objective lens and/or by the axis of rotation of the pole shoes thereof.

Otherwise, everything already described and stated within the scope of the description of the first aspect of the disclosure can also apply to the system combination according to the second aspect of the disclosure provided that no technical contradictions arise as a result.

A third aspect of the disclosure provides using a system combination as has been described in accordance with the first and second aspect of the disclosure. According to the third aspect of the disclosure, the system combination can be used to determine a position of the object and/or to determine a height profile of an object positioned in the object plane. Here, measuring the position of the object and/or the height profile of the object is optionally carried out with the aid of the light-optical system of the system combination. When determining the position of the object, it is possible to very precisely determine a working distance between a system component and the object in particular.

Other uses for the described system combinations according to the disclosure are also conceivable. By way of example, it is possible to use a system combination according to the disclosure for material ablation, with the material ablation in this case also being realized by the light-optical system. Further uses may include, e.g., optical tweezers or UV light detection. Further possible applications for the system combination according to the disclosure are found in U.S. Pat. No. 6,465,781 B1, for example.

The above-described embodiments of the disclosure can be combined with one another in full or in part, provided that no technical contradictions arise as a result.

BRIEF DESCRIPTION OF THE DRAWINGS

The disclosure will be understood even better with reference to the figures described below. In the figures.

DETAILED DESCRIPTION

Figure 1:
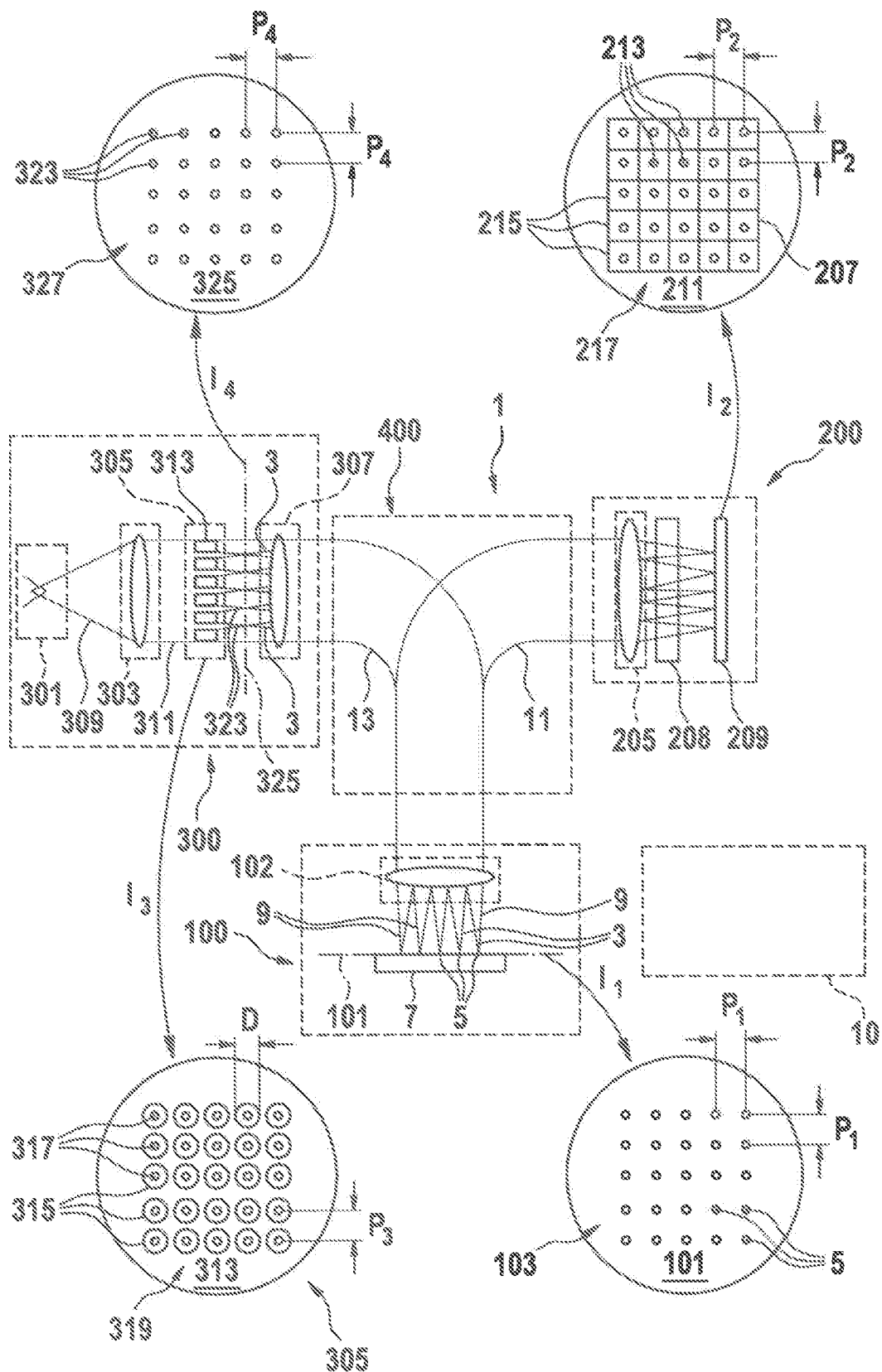
FIG. 1: shows a multi-beam particle microscope in a schematic illustration.

FIG. 1 is a schematic illustration of a particle beam system 1 in the form of a multi-beam particle microscope 1, which uses a multiplicity of particle beams. The particle beam system 1 generates a multiplicity of particle beams which impinge an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of sites 5 and generate there a plurality of electron beam spots, or spots, that are spatially separated from one another. The object 7 to be examined can be of any desired type, e.g. a semiconductor wafer or a biological sample, and include an arrangement of miniaturized elements or the like. The surface of the object 7 is disposed in a first plane 101 (object plane) of an objective lens 102 of an objective lens system 100.

The enlarged excerpt $I_1$ in FIG. 1 shows a plan view of the object plane 101 having a regular rectangular field 103 of sites of incidence 5 formed in the first plane 101. In FIG. 1, the number of sites of incidence is 25, which form a 5×5 field 103. The number 25 of sites of incidence is a number chosen for reasons of simplified illustration. In practice, the number of beams, and hence the number of sites of incidence, can be chosen to be significantly greater, such as, for example, 20×30, 100×100 and the like.

In the embodiment illustrated, the field 103 of sites of incidence 5 is a substantially regular rectangular field having a constant pitch $P_1$ between adjacent sites of incidence. Exemplary values of the pitch $P_1$ are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles impinging the object generate interaction products, e.g. secondary electrons, backscattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for supplying the multiplicity of secondary particle beams 9 to a detector system 200. The detector system 200 includes a particle-optical unit having a projection lens 205 for directing the secondary particle beams 9 onto a particle multi-detector 209.

The excerpt $I_2$ in FIG. 1 shows a plan view of the plane 211, in which individual detection regions of the particle multi-detector 209 on which the secondary particle beams 9 are incident at the sites 213 are located. The sites of incidence 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generating apparatus 300 including at least one particle source 301 (e.g. an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The excerpt $I_3$ in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are disposed in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which impinge the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle-optical unit for imaging the plane 325, in which the beam foci 323 are formed, onto the first plane 101 such that a field 103 of sites of incidence 5 or beam spots arises there. If a surface of the object 7 is disposed in the first plane, the beam spots are correspondingly formed on the object surface.

The objective lens 102 and the projection lens arrangement 205 provide a second imaging particle-optical unit for imaging the first plane 101 onto the detection plane 211. The objective lens 102 is thus a lens which is part of both the first and the second particle-optical unit, while the field lens 307 belongs only to the first particle-optical unit and the projection lens 205 belongs only to the second particle-optical unit.

A beam switch 400 is disposed in the beam path of the first particle-optical unit between the multi-aperture arrangement 305 and the objective lens system 100. The beam switch 400 is also part of the second optical unit in the beam path between the objective lens system 100 and the detector system 200.

Further information concerning such multi-beam particle beam systems and components used therein, such as, for instance, particle sources, multi-aperture plates and lenses, can be obtained from the international patent applications WO 2005/024881, WO 2007/028595, WO 2007/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

The multiple particle beam system furthermore has a computer system 10 configured both for controlling the individual particle-optical components of the multiple particle beam system and for evaluating and analyzing the signals obtained by the multi-detector 209. In this case, the computer system 10 can be constructed from a plurality of individual computers or components.

A multiple particle beam system as described above, or else a different individual particle beam system or a different multiple particle beam system, can now be combined in inventive fashion with a light-optical system.

Figure 4:
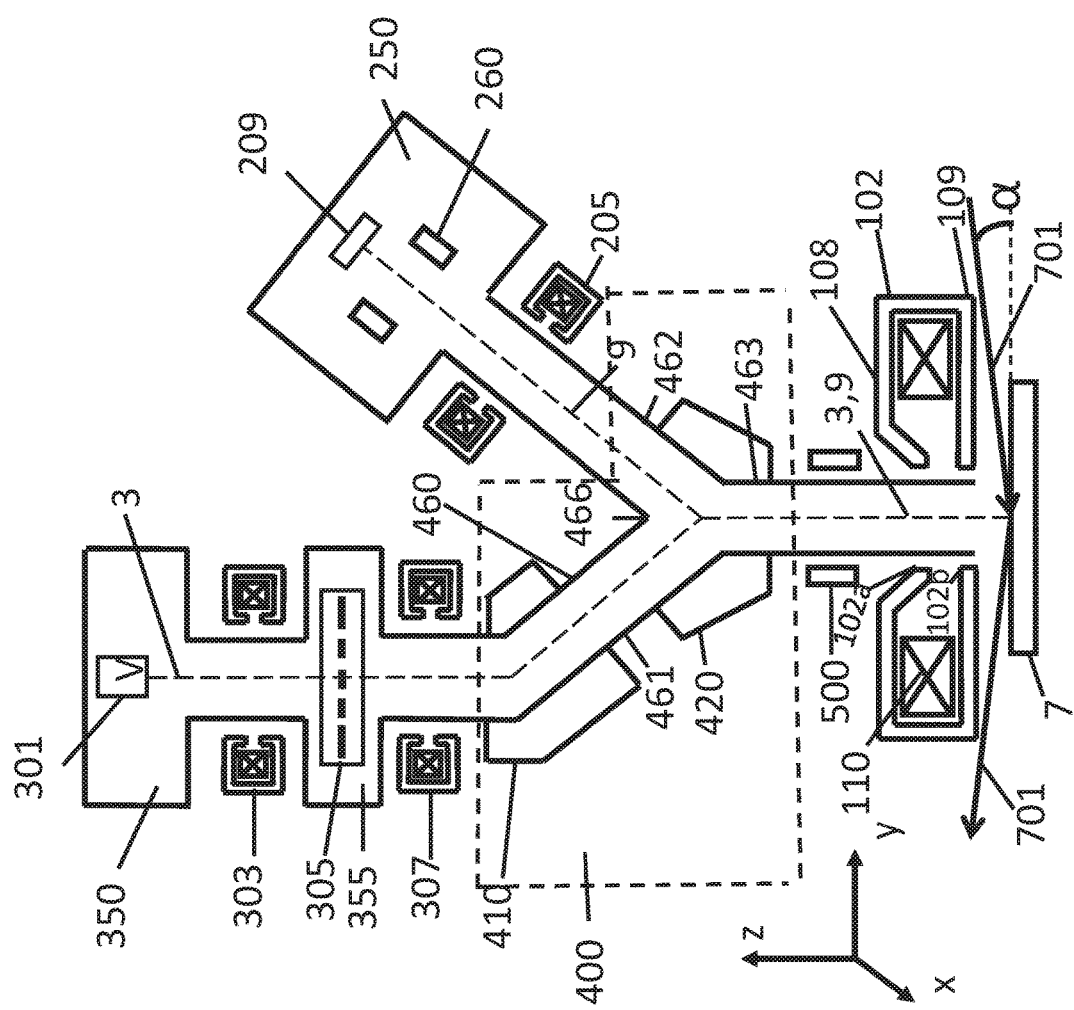
FIG. 4: shows a system combination with a multiple particle beam system and with a light-optical system, wherein the light is incident on the object under grazing light incidence.

Here, FIG. 4 initially shows a system combination with a multiple particle beam system and with a light-optical system, wherein the light is incident on the object under grazing light incidence. Correspondingly disposed light-optical systems, which are combined with a particle beam system, are also disclosed in, e.g., US 2013/0284924 A1 and US 2016/0211112 A1.

The multiple particle beam system initially includes a particle source 301. In the shown example, this particle source 301 emits an individual particle beam with charged particles, e.g., electrons. In FIG. 4, particle beams and a particle-optical beam path are illustrated schematically by the dashed line with reference sign 3. The individual particle beam initially passes through a condenser lens system 303 and subsequently impinges a multi-aperture arrangement 305. This multi-aperture arrangement 305, possibly with further particle-optical components, serves as a multi-beam generator. The first particle beams emanating from the multi-aperture arrangement 305 then pass through a field lens or a field lens system 307 and subsequently enter a beam switch 400. This beam switch 400 includes a beam tube arrangement 460, which has a Y-shaped embodiment in the example shown. After passing through the beam switch 400, the first particle beams pass through a scan deflector 500 and, thereupon, a particle-optical objective lens 102, before the first particle beams 3 are incident on an object 7. As a result of this incidence, secondary particles, e.g., secondary electrons, are released from the object 7. These secondary particles form second particle beams, which have assigned to them a second particle-optical beam path 9. After emerging from the object 7, the second particle beams initially pass through the particle-optical objective lens 102 and subsequently pass through the scan deflectors 500, before the second particle beams enter the beam switch 400. Subsequently, the second particle beams 9 emerge from the beam switch 400, pass through a projection lens system 205, pass through an electrostatic element 260 and then impinge a particle-optical detector unit 209.

Situated within the beam switch 400, there is the beam tube arrangement 460, which also extends beyond the beam switch 400 in the example shown. Splitting the beam path within the beam switch 400 into the first particle-optical beam path 3 and the second particle-optical beam path 9 is implemented within the beam switch 400 with the aid of magnetic sectors 410, 420.

The objective lens 102 has an upper pole shoe 108 and a lower pole shoe 109. A winding 110 for generating a magnetic field is situated between the two pole shoes 108 and 109. Here, the upper pole shoe 108 and the lower pole shoe 109 can be electrically insulated from one another. In the shown example, the particle-optical objective lens 102 is a magnetic lens; however, it could also be an electrostatic lens or a combined magnetic/electrostatic lens.

Now, the position and the dimensions of the particle-optical objective lens 102 is of particular importance for a system combination of the multiple particle beam system and a light-optical system. As is evident from FIG. 4, the particle-optical objective lens 102 is situated relatively close to the object 7. Typically, the distance A between the lower opening of the objective lens 102b or the lower pole shoe 109 and its opening 102b to the object 7 is approximately 0.5 mm≤A≤5 mm, optionally approximately 1.0 mm≤A≤2.0 mm.

In the shown system combination of, firstly, a particle beam system and, secondly, a light-optical system, light, i.e., electromagnetic radiation of any wavelength, is now directed onto the object 7 with grazing incidence (from the right in FIG. 4). The angle of incidence a of the light of a light beam 701 is typically only between approximately 3° and 8°.

Following the grazing incidence, the light beam 701 is reflected by the object 7 and can be detected by a detector (not illustrated). The illustrated grazing incidence of light is not sufficient for all desired aspects of a system combination with a particle beam system and a light-optical system. Instead, an improved system combination of a particle beam system and a light-optical system is desirable, which, in particular, allows both particle beams 3 and light beams 701 to respectively impinge an object 7 in substantially perpendicular fashion without reducing the resolution of the particle-optical system in the process.

Figure 2:
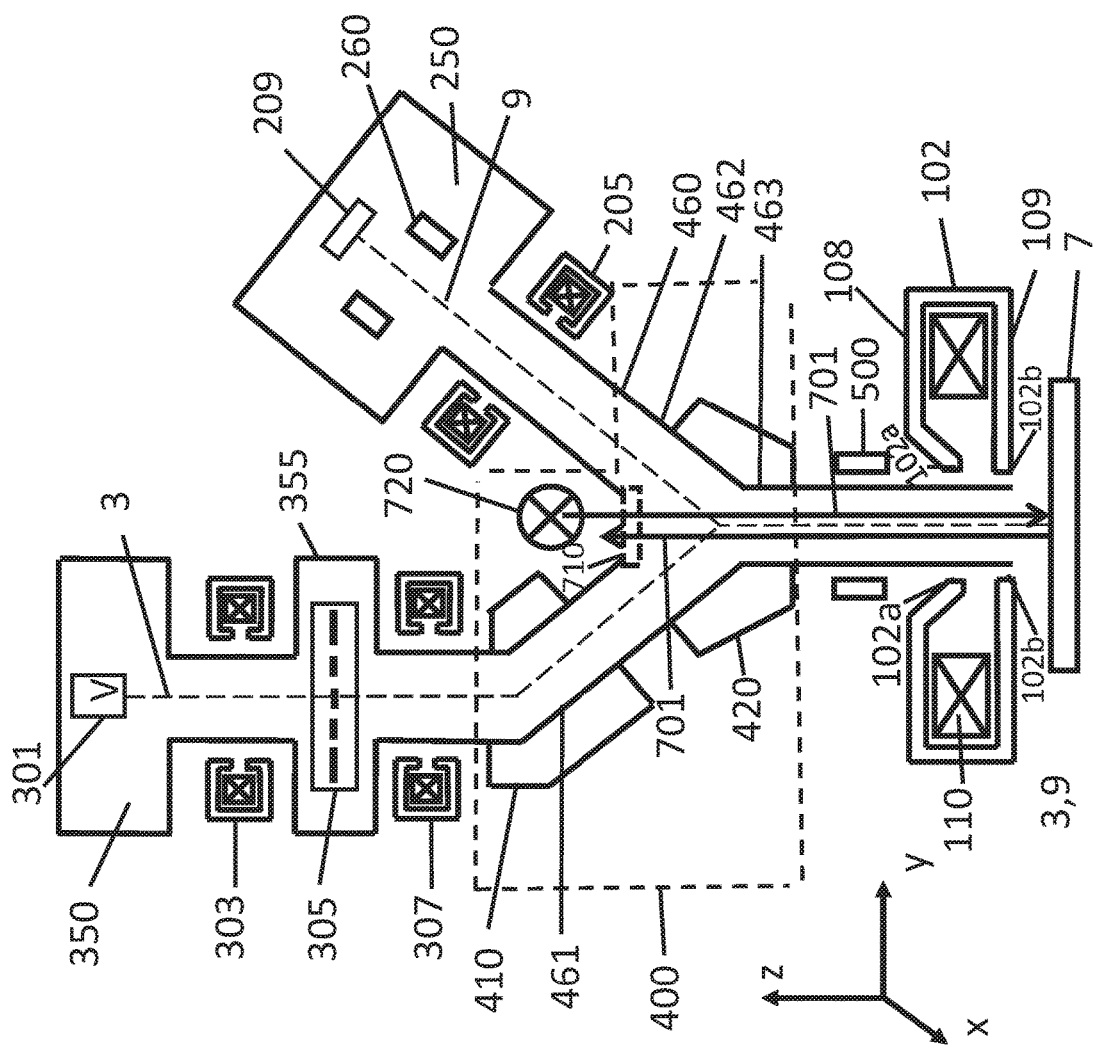
FIG. 2: shows a schematic sectional illustration of a system combination according to the disclosure.

FIG. 2 shows a schematic sectional illustration of a corresponding system combination according to the disclosure. The same reference signs in subsequent FIGS. 2 and 3 denote the same features as in FIG. 4 described above, even if these are not explicitly mentioned in any more detail below.

The beam tube arrangement 460 has a total of 3 beam tube limbs 461, 462 and 463. Only the first particle-optical beam path 3 extends through the first limb 461 and only the second particle-optical beam path 9 extends through the second limb 462. By contrast, both the first particle-optical beam path 3 and the second particle-optical beam path 9 extend through the third limb 463. Here, the shown beam tube arrangement 460 has a Y-shaped embodiment. Accordingly, the first particle-optical beam path 3 and the second particle-optical beam path 9 branch in Y-shaped fashion in the beam switch 400. A branching site 466 (cf. FIG. 4 on account of the better depictability) is situated in the wall of the beam tube arrangement 460 between the first limb 461 and the second limb 462 of the beam tube arrangement 460.

A light entry m 710, which is embodied as a window in the shown example, is situated in this region of the wall of the beam tube arrangement 460. This window 710 is optically transmissive and, at least on the beam tube inner side, provided with a coating that is electrically conductive and optically transparent. Here, this could be a coating with ITO or a metallic coating, in each case with a layer thickness in the nanometer range. This coating prevents unwanted electrical charging of the beam tube inner side surface of the window 710. Now, a light beam 701 enters the beam tube arrangement 460 through the window 710 in such a way that the light beam 701 impinges the object 7 disposed in the object plane in substantially collinear fashion with the first particle beam 3. In the shown example, the first particle beams 3 and the light beam 701 impinge the object 7 in collinear fashion along the z-direction and in substantially perpendicular fashion. In the process, no further light-optical component is disposed in the particle-optical beam path 3, 9 in the region where the particle-optical beam path 3, 9 and the light-optical beam path 701 overlap. Thus, the particle-optical beam path 3, 9 is not impaired by the arrangement of further light-optical components in its beam path.

Now, there are a plurality of options for coupling the light beam 701 into the beam tube arrangement 460 in the manner described. FIG. 2 illustrates a variant in which light is initially incident in the beam switch 400 through a light channel in a manner parallel to the surface of the object 7 and orthogonal to a plane spanned by the three limbs 461, 462 and 463 of the beam tube arrangement 460 and in which the light is deflected by substantially 90° in the light channel with the aid of a mirror 720. Here, in addition to two flat, interconnected structures for holding the magnetic sectors 410, 420, the beam switch 400 includes the already mentioned magnetic sectors 410 and 420 which are contained in, or secured to, the structures. In the process, the light channel, and hence the beam path of the light 701 within the beam switch 400, does not intersect any of the magnetic sectors 410 and 420. Therefore, the described direction of entry of the light to the deflection mirror 720 is particularly advantageous. Naturally, the light beam 701 can be reflected by the surface of the object 7 and can be reflected perpendicular to the surface of the object 7, substantially in collinear fashion with the second particle beams 9 and, in particular, in the opposite direction to the direction of the incident light beam 701, and can then also be coupled out of the beam tube arrangement 460 again through the window 710. The further light-optical beam path 701 then extends via the deflection mirror 720 and optionally via a beam splitter to a detector (the latter not being illustrated).

In the example illustrated in FIG. 2, the beam tube arrangement 460 also continues outside of the beam switch 400. Here, it extends, in particular, into the particle-optical objective lens 102. The beam tube arrangement 460 expands into vacuum chambers 350, 355 and 250 in the region of the particle source 301, in the region of the multi-aperture arrangement 305, and in the region of the detector unit 209. At least in the region of the beam switch 400 the beam tube arrangement is made from one piece, i.e., it has neither weld points or weld seams nor solder points or solder seams. The beam tube arrangement contains copper in the shown example; however, it could also include titanium or any other element or any other compound. Here, there is a high vacuum in the region of the beam tube arrangement 460 within the beam switch 400, optionally with a pressure of less than $10^{-5}$ mbar, in particular less than $10^{-7}$ mbar and/or $10^{-9}$ mbar. In the chambers 350, 355 and 250, already mentioned, there is a vacuum, optionally with respective pressures of less than $10^{-5}$ mbar, in particular less than $10^{-7}$ mbar and/or $10^{-9}$ mbar.

Figure 3:
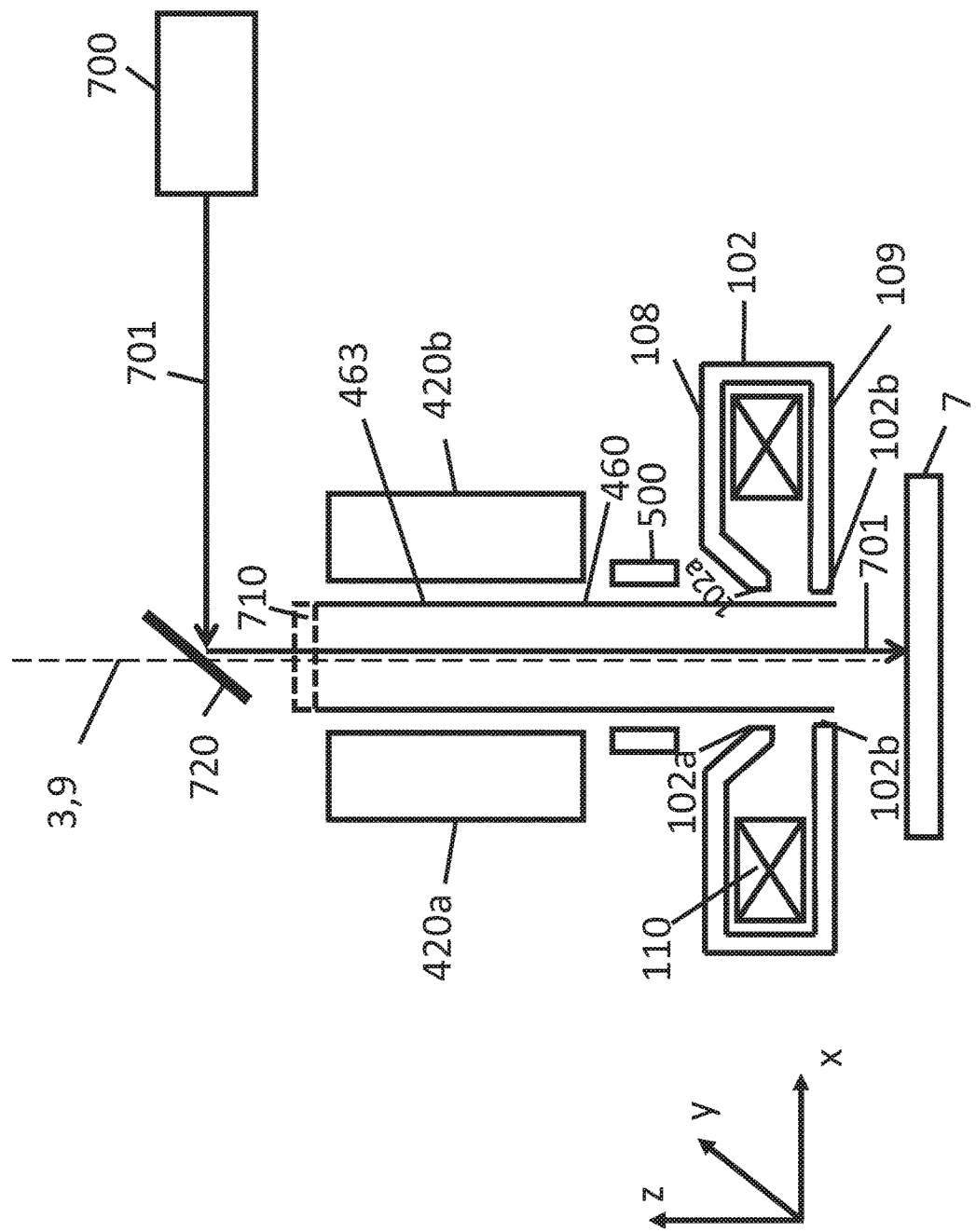
FIG. 3: schematically shows the light-optical beam path in the system combination, in an orientation that has been rotated by 90° in comparison with FIG. 2.

FIG. 3 schematically shows the light-optical beam path 701 in the system combination, in an orientation that has been rotated by 90° in comparison with FIG. 2. While the light-optical beam path 701 to the deflection mirror 720 extends perpendicular to the plane of the drawing in FIG. 2 and is subsequently deflected into the plane of the drawing by the deflection mirror 720 and is consequently only illustrated partly in view (the plane of the drawing is the yz-plane), the particle-optical beam path 701 is fully in the plane of the drawing spanned by the direction vectors x and z in the illustration rotated by 90°. A laser 700, which can be operated in continuous or pulsed fashion, serves as a light source 700 in the shown example. The light 701 emanating from the laser 700 is deflected by substantially 90° by the deflection mirror 720 and enters the beam tube arrangement 460 through the window 710. Subsequently, the light beam 701 impinges the object 7 disposed in the object plane in substantially collinear fashion with the first particle beam 3. It is also easily identifiable from the illustration of the xz-plane that the magnetic sectors 410 and 420 have a two-part design and are disposed on different sides of the beam tube arrangement 460 (the magnetic sector 410 is not illustrated in FIG. 3). Here, the second magnetic sector 420 is made up of two components 420a and 420b. The third limb 463 of the beam tube arrangement 460, in particular, extends between these two components 420a and 420b. To have a better overview, the other limbs 461 and 462 of the beam tube arrangement 460 have not been explicitly illustrated in FIG. 3.

From a combination of FIGS. 2 and 3, it is moreover evident that the magnetic objective lens 102 is an objective lens 102 with a substantially rotationally symmetric embodiment. An alternative to the embodiment of the disclosure illustrated in FIGS. 2 and 3 consists of replacing the deflection mirror 720 and the window 710 with a combined component, specifically a prism. In the case of a right-angled prism, there is a corresponding deflection of the light beam by 90° at the inner side of the face assigned to the hypotenuse by way of total-internal reflection. The short side face of the prism disposed on the beam tube side then adopts the function of the window 710. Here, this side face of the prism is once again provided with a coating that is electrically conductive and optically transparent; by way of example, the coating includes ITO or a metallic coating with a layer thickness in the nanometer range. Here, the prism can be applied directly to the beam tube arrangement 460 and, in particular, be adhesively bonded to the latter. In this way, a vacuum-tight arrangement of a light entry mechanism 710 is realized using a few optical components at a branching site 466 of the beam tube arrangement 460.

The embodiment variants of the disclosure illustrated in FIGS. 2 and 3 can be supplemented by light-optical detectors in a manner known to a person skilled in the art.

Moreover, the system combination can be used in multifaceted ways, in particular for determining a position of the object 7 and/or for determining a height profile of the object 7. Further application options include the use as optical tweezers or for material ablation, and for detecting cathodoluminescence, which can be emitted from the surface of the object 7 by bombardment with electrically charged particles.

The illustrated embodiments in the figures should not be construed as restrictive for the disclosure overall; they only serve illustrative purposes.

What is claimed is:

1. A system combination, comprising:
    a multiple particle beam system configured to provide a particle-optical beam path, the multiple particle beam system comprising:
        a multi-beam particle source configured to generate a first field of a multiplicity of first particle beams;
        a first particle-optical unit having a first particle-optical beam path, the first particle-optical unit configured so that, during use of the system combination, the first particle-optical unit directs the first particle beams onto an object plane so that the first particle beams impinge the object plane sites of incidence forming a second field;
        a detector unit comprising a plurality of detection regions disposed in a third field;
        a second particle-optical unit having a second particle-optical beam path, the second particle-optical unit being configured so that, during use of the system combination, the second particle-optical unit images second particle beams, which emanate from the sites of incidence in the second field, onto the third field;
        a particle-optical objective lens configured so that, during use of the system combination, the first and the second particle beams pass through the particle-optical objective lens;
        a beam switch disposed: i) in the first particle-optical beam path between the multi-beam particle source and the objective lens; and ii) in the second particle-optical beam path between the objective lens and the detector unit, the first and second particle-optical beam paths branching within the beam switch, the beam switch comprising a beam tube arrangement in which the particle-optical beam path extends, and the beam tube arrangement being disposed at a branching site; and a light entry mechanism at the branching site; and a light-optical system configured to provide a light-optical beam path, the light-optical system comprising:
a light source; and
a light-optical unit configured to direct a light beam onto the object plane, wherein, during use of the system combination, the light beam enters the beam tube arrangement through the light entry mechanism so that the light beam impinges the object plane in substantially collinear fashion with the first particle beams.

2. The system combination of claim 1, wherein:
the beam tube arrangement comprises three beam tube limbs; and
during use of the system combination:
only the first particle-optical beam path extends through the first limb;
only the second particle-optical beam path extends through the second limb; and
both the first and second particle-optical beam paths extend through the third limb.

3. The system combination of claim 1, wherein during use of the system combination:
the first and the second particle-optical beam paths extend at least partly in parallel through the third limb and are configured to emerge from the third limb in a z-direction; and
the light-optical unit is configured so that the light beam entering into the beam tube arrangement from the light entry mechanism impinges the object plane in collinear fashion with the first particle beams in the z-direction.

4. The system combination of claim 1, wherein the system combination is configured so that, during use of the system combination, the first particle beams and the light beam impinge the object plane in substantially perpendicular fashion.

5. The system combination of claim 1, wherein the beam switch comprises a light channel extending from its outer face to the light entry mechanism in the light-optical beam path.

6. The system combination of claim 4, wherein a light entry direction into the light channel extends substantially perpendicular to the plane that is spanned by the beam tube arrangement.

7. The system combination of claim 1, wherein the beam switch comprises a magnetic sector configured to deflect the particle beams, and the light channel does not intersect any of the magnetic sectors.

8. The system combination of claim 1, further comprising a light deflection mechanism within the light channel to deflect the light beam.

9. The system combination of claim 8, wherein:
the light deflection mechanism is configured to deflect the light beam by approximately 90°; and
the entry direction of the light beam onto the light deflection mechanism extends: i) substantially parallel to the object plane; and/or ii) perpendicular to the plane spanned by the beam tube arrangement.

10. The system combination of claim 8, wherein the light deflection mechanism comprises a mirror or a prism.

11. The system combination of claim 1, wherein the light entry mechanism comprises a window.

12. The system combination of claim 1, wherein the light entry mechanism comprises a prism configured to be a light deflection mechanism.

13. The system combination of claim 12, wherein the prism is directly disposed on the beam tube arrangement.

14. The system combination of claim 1, wherein the light entry mechanism comprises a coating on the beam tube side, and the coating is electrically conductive and optically transparent.

15. The system combination of claim 14, wherein the coating comprises ITO or a metallic coating with a layer thickness in the nanometer range.

16. The system combination of claim 1, wherein the beam tube arrangement comprises copper and/or titanium, and/or wherein the beam tube arrangement is made from one piece.

17. The system combination of claim 1, wherein the system combination is configured so that, during use of the system:
a vacuum is provided in the particle beam system along the particle-optical beam path; and/or
a high vacuum is provided within the beam tube arrangement within the beam switch.

18. The system combination of claim 1, wherein:
the particle-optical objective lens comprises at least one member selected from the group consisting of a magnetic lens, an electrostatic lens and a combined magnetic/electrostatic lens; and/or
the particle-optical objective lens has a single opening configured so that, during use of the system, the first particle beams, the second particle beams and the light pass through the single opening.

19. The system combination of claim 1, wherein the light-optical system comprises a light detector.

20. The system combination of claim 1, wherein a light-optical beam splitter is disposed in the light-optical beam path between: i) the light source and the light entry mechanism; and ii) between the light entry mechanism and the light detector.

21. The system combination of claim 1, wherein the particle-optical system and/or the light-optical system is configured to carry out a scanning movement with a particle beam and/or light beam in the object plane.

22. The system combination of claim 1, wherein no further light-optical components are provided in the light-optical beam path between the light entry mechanism and the object plane.

23. The system combination of claim 1, wherein:
no light-optical component is provided in the first particle-optical beam path; and/or
no light-optical component is provided in the second particle-optical beam path.

24. The system combination of claim 1, wherein the light source comprises a laser.

25. The system combination of claim 1, wherein the first and second particle-optical beam paths branch in a Y-shaped fashion, and the beam tube arrangement branches in a Y-shaped fashion at the branching site.

26. A method, comprising:
using the system combination of claim 1 to determine: i) a position of the object; and/or ii) a height profile of an object in the object plane.

27. A system combination, comprising:
a multiple particle beam system configured to provide a particle-optical beam path, the multiple particle beam system comprising:
a multi-beam particle source configured to generate a first field of a multiplicity of first particle beams;

a first particle-optical unit having a first particle-optical beam path, the first particle-optical unit being configured so that, during use of the system combination, the particle-optical unit directs the first particle beams onto an object plane such that the first particle beams impinge the object plane at sites of incidence, which form a second field;

a detector unit comprising a plurality of detection regions disposed in a third field;

a second particle-optical unit having a second particle-optical beam path, the second particle-optical unit being configured so that, during use of the system combination, the second particle-optical unit images second particle beams, which emanate from the sites of incidence in the second field, onto the third field;

a particle-optical objective lens configured so that, during use of the system combination, the first and second particle beams pass through the particle-optical objective lens;

a beam switch disposed: i) in the first particle-optical beam path between the multi-beam particle source and the objective lens; and ii) in the second particle-optical beam path between the objective lens and the detector unit, the first and second particle-optical beam paths branching within the beam switch, wherein the beam switch comprises a beam tube arrangement in which the particle-optical beam path extends, and the beam tube arrangement is disposed at a branching site; and a light entry mechanism at the branching site; and a light-optical system configured to provide a light-optical beam path, the light-optical system comprising:

a light detector; and a light-optical unit configured to direct a light beam, which emanates from the object plane during use of the system combination, onto the light detector, wherein, during use of the system combination, the light beam emanating from the object plane enters into the beam tube arrangement in substantially collinear fashion with the second particle beams and leaves the beam tube arrangement through the light entry mechanism.

28. The system combination of claim 27, wherein the first and second particle-optical beam paths branch in a Y-shaped fashion, and the beam tube arrangement branches in a Y-shaped fashion at the branching site.

\* \* \* \* \*

UNITED STATES PATENT AND TRADEMARK OFFICE
CERTIFICATE OF CORRECTION

PATENT NO.        : 11,087,955 B2
APPLICATION NO.   : 16/939706
DATED             : August 10, 2021
INVENTOR(S)       : Zeidler et al.

It is certified that error appears in the above-identified patent and that said Letters Patent is hereby corrected as shown below:

In the Specification

Column 2, Line 27, delete "a" and insert -- $\alpha$ --;

Column 14, Line 3, delete "a" and insert -- $\alpha$ --.

Signed and Sealed this
Twentieth Day of September, 2022

Katherine Kelly Vidal
*Director of the United States Patent and Trademark Office*